United States Patent
Köhler (10) Patent No.: US 11,531,078 B2
(45) Date of Patent: Dec. 20, 2022

(54) TIME-SAVING GENERATION OF A $B_0$ MAP BASED ON A DUAL ECHO SEQUENCE WITH STIMULATED ECHOES

(71) Applicant: Siemens Healthcare GmbH, Erlangen (DE)

(72) Inventor: Michael Köhler, Nuremberg (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/477,774

(22) Filed: Sep. 17, 2021

(65) Prior Publication Data

US 2022/0099767 A1   Mar. 31, 2022

(30) Foreign Application Priority Data

Sep. 29, 2020   (DE) ...................... 10 2020 212 281.4

(51) Int. Cl.
  *G01R 33/44* (2006.01)
  *G01R 33/565* (2006.01)
  *G01R 33/54* (2006.01)

(52) U.S. Cl.
  CPC ......... *G01R 33/443* (2013.01); *G01R 33/543* (2013.01); *G01R 33/56518* (2013.01)

(58) Field of Classification Search
  CPC .............. G01R 33/443; G01R 33/543; G01R 33/56518; G01R 33/56527; G01R 33/243
  See application file for complete search history.

(56) References Cited

U.S. PATENT DOCUMENTS

| | | | |
|---|---|---|---|
| 9,977,106 B2 | 5/2018 | Nehrke et al. | |
| 2014/0218022 A1 | 8/2014 | Koehler et al. | |
| 2015/0002149 A1* | 1/2015 | Nehrke | G01R 33/54 |
| | | | 324/309 |

FOREIGN PATENT DOCUMENTS

| | | |
|---|---|---|
| DE | 102013201671 B3 | 7/2014 |
| EP | 2615470 A1 | 7/2013 |

OTHER PUBLICATIONS

German Office Action for German Application No. 10 2020 212 281.4 dated Aug. 6, 2021.
Nehrke, Kay, and Peter Börnert. "DREAM—a novel approach for robust, ultrafast, multislice B1 mapping." Magnetic resonance in medicine 68.5 (2012): 1517-1526.
Niederländer, Benjamin, and Peter Blümler. "Simple eddy current compensation by additional gradient pulses." Concepts in Magnetic Resonance Part A 47.1 (2018): e21469. pp. 1-7.

* cited by examiner

*Primary Examiner* — G. M. A Hyder
(74) *Attorney, Agent, or Firm* — Lempia Summerfield Katz LLC (57) ABSTRACT

The disclosure relates to a method for generating a $B_0$ map for a magnetic resonance examination of an examination subject, a magnetic resonance device, and a computer program product for executing the method. The method provides for the application of at least two preparatory RF pulses during a preparatory stage and at least one readout RF pulse during an acquisition stage. At least one stimulated echo signal is acquired after the readout RF pulse. A $B_0$ map that shows the actual spatial distribution of the magnetic field strength of the main magnetic field is derived from the at least one acquired FID echo signal and the at least one acquired stimulated echo signal.

16 Claims, 5 Drawing Sheets

10 Magnetic resonance device
11 Magnet unit
12 Main magnet
13 Strong main magnetic field
14 Examination space
15 Patient
16 Patient positioning device
17 Patient table
18 Gradient coil unit
19 Gradient control unit
20 Radio frequency antenna unit
21 Radio frequency antenna control unit
22 System control unit
23 User interface
24 Display unit
25 Input unit

FIG 1

10 Magnetic resonance device
11 Magnet unit
12 Main magnet
13 Strong main magnetic field
14 Examination space
15 Patient
16 Patient positioning device
17 Patient table
18 Gradient coil unit
19 Gradient control unit
20 Radio frequency antenna unit
21 Radio frequency antenna control unit
22 System control unit
23 User interface
24 Display unit
25 Input unit

TIME-SAVING GENERATION OF A $B_0$ MAP BASED ON A DUAL ECHO SEQUENCE WITH STIMULATED ECHOES

The present patent document claims the benefit of German Patent Application No. 10 2020 212 281.4, filed Sep. 29, 2020, which is hereby incorporated by reference in its entirety.

TECHNICAL FIELD

The disclosure relates to a method for generating a $B_0$ map for a magnetic resonance examination of an examination subject, a magnetic resonance device, and a computer program product for executing the method.

BACKGROUND

In medical technology, imaging using magnetic resonance (MR), also referred to as magnetic resonance tomography or magnetic resonance imaging (MRI), is characterized by high soft tissue contrast resolution. MRI techniques use a magnetic resonance device to apply radio-frequency (RF) pulses to generate an RF field (also referred to as the $B_1$ field) and gradient pulses to generate a magnetic field gradient to an examination space in which the examination subject is located. This triggers spatially encoded echo signals in the patient that may be referred to as magnetic resonance signals. The magnetic resonance signals are received by the magnetic resonance device as measurement data and used to reconstruct magnetic resonance images.

A strong static main magnetic field is also generated in the examination space. This main magnetic field may be as homogeneous as possible to avoid artifacts in the magnetic resonance images. In reality, however, the main magnetic field may exhibit inhomogeneities in some locations that lead to instances of off-resonance, which is to say the actual resonant frequency deviates in these locations from a desired resonant frequency.

Partly to be able to compensate for these inhomogeneities in the main magnetic field, it is fairly common practice in the context of magnetic resonance examinations to generate a $B_0$ map that shows the actual spatial distribution of the magnetic field strength of the main magnetic field. The measurement of $B_0$ field distributions may also be referred to as $B_0$ mapping. A $B_0$ map may be used for the patient-specific optimization of shim currents, for the determination of a local resonant frequency, or for certain image correction procedures.

A $B_0$ map may be generated using MR sequences with multiple, (e.g., two), echo signals from whose phase difference a spatial distribution of the resonant frequency is calculated. The resonant frequency, in turn, is proportionate to the $B_0$ field strength, so the result is a $B_0$ map. In one example, two echo signals are measured (for example, in a gradient echo sequence) whose echo times differ by $\Delta TE$. Once the measured data belonging to the two echo signals has been reconstructed, the resonant frequency f or the $B_0$ field strength is calculated from their phase difference $\Delta\Phi$ as follows:

$$B_0 = \frac{2\pi f}{\gamma}; f = \frac{\Delta\Phi}{2\pi\Delta TE} \qquad (\text{Eq. 1})$$

wherein $\gamma$ is the gyromagnetic ratio.

The magnetic resonance signals of a human body as the examination subject originate in a customary magnetic resonance examination from protons bound in fat and water. Fat and water have different resonant frequencies with the same $B_0$ field, however, due to a chemical shift. The difference amounts to approximately 3.4 ppm.

The leads inter alia to the following problems. It may be the resonant frequency of protons bound in water that is of interest. If the echo signal in a location is dominated by fat, the measured resonant frequency with the same $B_0$ field will be distorted. Ordinarily, the $B_0$ field is calculated from the measured resonant frequency without knowing precisely by which chemical component (fat or water) the signal in a particular location is dominated. The chemical shift, however, results in different resonant frequencies with the same $B_0$ field. Owing to off-resonance, the cumulative phase difference in voxels that contain both fat and water is no longer proportional to the difference in the echo times because of the aliasing effects that occur. This proportionality is a prerequisite for Equation 1, wherein the phase difference $\Delta\Phi$ is assumed to be proportionate to the time $\Delta TE$.

These effects/problems may be addressed in the prior art by choosing the difference between the echo times $\Delta TE$ so that fat and water experience the same dephasing during this time:

$$\Delta TE = N * \frac{1}{3.4 ppm * f} \qquad (\text{Eq. 2})$$

wherein N here is an integer.

Depending on the respective strength of the basic magnetic field (with N=1), this produces a time duration for $\Delta TE$ of 2.4 ms with a field strength of the main magnetic field of 3 T. This time duration, however, increases ever more strongly for lower field strengths.

The suitable difference in the echo times (and hence also the total measurement time required) is thus significantly longer for lower field strengths than for higher field strengths.

SUMMARY AND DESCRIPTION

The object of this disclosure may be understood as the specification of a method for the more rapid measurement of a B0 map with the same volume coverage and resolution. It would also be beneficial to make the measurement time largely independent of the field strength.

The scope of the present disclosure is defined solely by the appended claims and is not affected to any degree by the statements within this summary. The present embodiments may obviate one or more of the drawbacks or limitations in the related art.

The following method for the generation of a $B_0$ map for a magnetic resonance examination of an examination subject is accordingly proposed. A main magnetic field with a target magnetic field strength $B_{0,target}$ is generated. An imaging sequence with a preparatory stage and a subsequent acquisition stage is applied to an examination space in which the examination subject is located. This imaging sequence includes the application of two preparatory RF pulses during the preparatory stage, with a first of the at least two preparatory RF pulses being applied at a time $t_1$, a second of the at least two preparatory RF pulses being applied at a time $t_2$, wherein times $t_1$ and $t_2$ are separated by a period TS. The imaging sequence additionally includes the application of at least one readout RF pulse at a time $t_3$ during the acquisition stage. In addition, at least one FID echo signal is acquired after the readout RF pulse at a time $t_4$, wherein times $t_3$ and $t_4$ are separated by a period $TE_{FID}$. At least one stimulated echo signal is additionally acquired after the readout RF pulse at a time $t_5$, wherein times $t_3$ and $t_5$ are separated by a period $TE_{STE}$. $TE_{STE}$ may be larger or smaller than $TE_{FID}$, which means, in other words, that the FID echo signal may be acquired either before or after the stimulated echo signal. A $B_0$ map that shows the actual spatial distribution of the magnetic field strength of the main magnetic field is derived from the at least one acquired FID echo signal and the at least one acquired stimulated echo signal.

The period TS is chosen here as a function of the times $TE_{FID}$ and $TE_{STE}$ so that, between times $t_4$ and $t_5$, a signal component of the echo signals (e.g., of the at least one FID echo signal and the at least one stimulated echo signal) from protons bound in water has the same phase difference as a signal component of the echo signals (e.g., of the at least one FID echo signal and the at least one stimulated echo signal) from protons bound in fat.

In other words, the period TS is chosen as a function of the periods $TE_{FID}$ and $TE_{STE}$ so that echo signal components (e.g., echo signal components that contribute to the at least one FID echo signal and the at least one stimulated echo signal) from protons bound in water and echo signal components (e.g., echo signal components that contribute to the at least one FID echo signal and the at least one stimulated echo signal) from protons bound in fat experience the same dephasing. For example, the echo signals, (e.g., the at least one FID echo signal and the at least one stimulated echo signal), exhibit a signal component from protons bound in water and a signal component from protons bound in fat. The period TS is chosen as a function of the periods $TE_{FID}$ and $TE_{STE}$ so that the signal component from protons bound in water has the same phase difference as the signal component from protons bound in fat between the times $t_4$ and $t_5$. For example, the echo signals, (e.g., the at least one FID echo signal and the at least one stimulated echo signal), exhibit a signal component from protons bound in water and a signal component from protons bound in fat. The signal component from protons bound in water have a first phase difference between times $t_4$ and $t_5$ and the signal component from protons bound in fat have a second phase difference between times $t_4$ and $t_5$. The period TS is chosen as a function of the periods $TE_{FID}$ and $TE_{STE}$ so that the first phase difference and the second phase difference are the same.

The period TS may be chosen as a function of a target magnetic field strength $B_{0,target}$ of the main magnetic field so that the signal component of the echo signals from protons bound in water has the same phase difference as the signal component of the echo signals from protons bound in fat between times $t_4$ and $t_5$.

The main magnetic field may be generated by a main magnet, e.g., a superconducting main magnet. The main magnetic field may be generated in the examination space. The main magnet may be arranged around a gradient coil unit for the generation of gradient pulses and/or around a radio frequency antenna unit for the generation of RF pulses, e.g., the at least two preparatory RF pulses and/or the at least one readout RF pulse. The examination space may be cylindrical in shape. The main magnet, the gradient coil unit, and/or the radio frequency antenna unit may surround the examination space.

The main magnet, the gradient coil unit, and/or the radio frequency antenna unit may form part of a magnetic resonance device. The magnetic resonance device may have a system control unit for controlling the main magnet, the gradient coil unit, and/or the radio frequency antenna unit. The system control unit may control the application of the imaging sequence.

The imaging sequence, which may also be referred to, by way of example, as the magnetic resonance sequence, may include additional stages such as an adjustment stage as well as the preparatory stage and the acquisition stage. The imaging sequence may include not just one, but also multiple preparatory stages, each with a subsequent acquisition stage. It is possible, for example, to record one slice of the examination subject with each sequence unit, which sequence unit includes a preparatory stage and a subsequent acquisition stage.

The acquisition of the echo signals, (e.g., the at least one FID echo signal and/or the at least one stimulated echo signal), may be performed with at least one local coil, which is arranged directly on the body of the examination subject, or the radio frequency antenna unit, which is permanently installed in the magnetic resonance device.

The magnetic resonance device may also include an evaluation unit that is able to derive a $B_0$ map. The evaluation unit may include one or more processors and/or an electronic memory for this purpose. The evaluation unit may form a part of the system control unit.

The $B_0$ map may be used for the patient-specific optimization of shim currents, for the determination of a local resonant frequency, or/and for the performance of image correction procedures.

Longitudinal magnetization is advantageously prepared in the preparatory stage. Transverse magnetization additionally generated may be dephased by a spoiler gradient pulse after the second of the at least two preparatory RF pulses in the preparatory stage.

The at least one stimulated echo signal generated from the longitudinal magnetization prepared in the preparatory stage is in particular refocused in the acquisition stage. Additionally, the at least one FID echo signal, which may be regarded as a free induction decay (FID) signal and the phase angle of which was not prepared in the preparatory stage, is in particular refocused in the acquisition stage.

The periods TS, $TE_{FID}$, and $TE_{STE}$ may be chosen so that an effective dephasing time $\Delta TE_{eff}$ is not equal to zero, that is to say does not disappear. This effective dephasing time $\Delta TE_{eff}$ here may denote the difference between the periods during which the signals of the two echoes each accumulate a phase due to off-resonance. The FID echo signal accumulates a phase during the period $TE_{FID}$. The stimulated echo signal initially accumulates during the period TS a phase inverted by the readout RF pulse. The phase then additionally accumulates during the time $TE_{STE}$ so that the phase accumulation period for the stimulated echo signal amounts to $-TS+TE_{STE}$. Consequently, the difference in the phase accumulation period is $\Delta TE_{eff} = TE_{FID} - (-TS+TE_{STE})$.

$TE_{FID}$ may denote the echo time of the FID gradient echo signal, $TE_{STE}$ the echo time of the stimulated echo signal, and TS the gap (or center-center) between the preparatory RF pulses in the preparatory stage. The echo times here are, for example, measured between the maximum and/or center of the readout RF pulse of the acquisition stage and the respective echo signal and may be adjusted by the choice of suitable gradient pulses to be applied, in particular, regarding the sign and/or amplitude. The resonant frequency f or the $B_0$ map may be calculated from the measured phase differences according to Equation 1 by replacing $\Delta TE$ in the equation with $\Delta TE_{eff}$.

An appropriate choice of the periods $TE_{FID}$ and $TE_{STE}$ may not result in echo signals from protons bound in water and echo signals from protons bound in fat experiencing the same dephasing, rather TS is adjusted instead. The period TS may be extended for this purpose.

This extension of the period TS may initially also cause an extension of the measurement time, but this extension only has to be accepted once per slice measured, whereas additional time is required for each k-space row of a slice with conventional methods. The overall measurement time for a magnetic resonance examination may thus advantageously be reduced.

A further embodiment of the method provides for the choice of the period TS to include the following acts: specifying the periods $TE_{FID}$ and $TE_{STE}$ so that these are as short as possible; and determining the period TS as a function of the previously specified periods $TE_{FID}$ and $TE_{STE}$.

As described above, that may lead to an extension of the period TS, but this extension is offset or more than offset subsequently.

A further embodiment of the method provides for:

$$TS = N * \frac{1}{\delta_{WF} * (\gamma/2\pi) * B_{0,target}} + TE_{STE} - TE_{FID}, \quad \text{(Eq. 3)}$$

where N is an integer>0, $\delta_{WF}$ indicates the chemical shift of water and fat, and $\gamma$ indicates the gyromagnetic ratio of protons bound in water.

The value of 3.4 ppm may be specified for $\delta_{WF}$. The value of 42.577 MHz/T may be specified for $\gamma/2\pi$.

The first summand on the right-hand side of Equation 3 may be understood as the extension of the period TS so that the echo signals from protons bound in water and echo signals from protons bound in fat experience the same dephasing.

In certain examples, N=1 to keep the additional measurement time attributable to TS as low as possible.

A further embodiment of the method provides for the target magnetic field strength $B_{0,target}$ to be less than 2 T, in particular less than 1 T.

A particularly large reduction in the measurement time as compared with conventional methods may be achieved with low field strengths.

A value of just 2.4 ms results for $\Delta TE$ according to Equation 2 at 3 T, but this already rises to 4.8 ms at 1.5 T and reaches 12 ms at 0.6 T.

The suitable echo time difference (and hence also the total measurement time required) is thus significantly longer for lower field strengths than for higher field strengths. Total measurement times for magnetic resonance examinations may be several seconds longer at low field strengths than at higher field strengths when applying conventional methods.

The method proposed, however, advantageously makes the measurement time independent of the field strength used, as the use of the preparatory stage means that additional time need be spent only once in order to adjust the effective dephasing time for the entire subsequent acquisition stage, in particular, the echo train.

A further embodiment of the method provides for $TE_{FID}$<5 ms and $TE_{STE}$<6 ms, in particular, $TE_{FID}$<2.5 ms and $TE_{STE}$<3.5 ms.

Smaller values may be chosen for $TE_{FID}$ and $TE_{STE}$ by adjusting the period TS as a function of $TE_{FID}$ and $TE_{STE}$.

This is advantageous in particular because the magnetization prepared in the preparatory stage relaxes again in the course of the acquisition stage (e.g., as a result of T1 relaxation), in particular the echo train, and distortions or artifacts may consequently appear. The method proposed thus advantageously enables time-optimized timing.

A further embodiment of the method provides for the acquired FID echo signals and stimulated echo signals not to be suitable for use in deriving a $B_1$ map that shows a spatial distribution of the flip angles of the at least two preparatory RF pulses.

The method proposed is instead focused on generating a $B_0$ map. Extending TS may have the effect, especially at low field strengths, that with customary sequence timing, T2* compensation of the two echoes may no longer happen, which makes this parameterization unsuitable for the reconstruction of a $B_1$ map.

If $\Delta TE_{eff}$ does not equal zero and TS does not equal $TE_{STE}+TE_{FID}$, the FID echo signal and the stimulated echo signal have a different T2* weighting. This will distort a $B_1$ map based thereon. A method intended primarily to generate a $B_1$ map may therefore not be suitable for generating a $B_0$ map, especially at low field strengths of the main magnetic field.

A further embodiment of the method provides for there to be applied to the examination space for the purpose of adjusting the periods $TE_{STE}$ and $TE_{FID}$: at least one gradient pulse $G_{prep}$ between the at least two preparatory RF pulses during the preparatory stage; at least one gradient pulse $G_{ROdeph}$ after the application of the readout RF pulse and before the acquisition of the at least one FID signal and at least one stimulated echo signal during the acquisition stage; and at least one gradient pulse $G_{RO}$ during the acquisition of the at least one FID signal and at least one stimulated echo signal during the acquisition stage. The amplitude of the gradient pulse $G_{RO}$ may have the opposite sign to the amplitude of the gradient pulse $G_{ROdeph}$.

A gradient echo signal may occur when the rephasing gradient moment is equal to a preceding dephasing gradient moment. The gradient moment of a gradient pulse may be understood to be its time integral. The times t4 and t5 of the FID echo signal and the stimulated echo signal may be adjusted accordingly by the timing and form of the gradient pulses.

It may be the case that $TE_{FID}$<$TE_{STE}$. The order of the echoes in the acquisition stage is advantageously chosen so that with the sequence timing may be achievable for the two echoes fat and water are in phase as far as possible with the sequence timing otherwise minimized as far as possible. Signal loss due to fat and water components in phase opposition may otherwise occur in voxels in which both chemical bonding types are present. It is advantageous for $TE_{FID}$<$TE_{STE}$ especially with low field strengths, in particular field strengths of less than 2 T or less than 1 T.

At 3 T, for example, fat and water are in phase opposition after ~1.2 ms and in phase after ~2.4 ms. Therefore at 3 T, $TE_{FID}$ may be as close as possible to 2.4 ms, for example. For lower field strengths, on the other hand, it is better to keep $TE_{FID}$ as small as possible in order to remain as far as possible from the time of phase opposition (for example at 1.5 T: ~2.4 ms).

A further embodiment of the method provides for the acquisition stage to include a gradient echo train with multiple readout RF pulses, at least one FID signal triggered by the readout RF pulse, and at least one stimulated echo signal triggered by the readout RF pulse being acquired after each readout RF pulse of the gradient echo train. One k-space row may be recorded with each of the multiple readout RF pulses.

The acquisition stage in particular includes N elements, where N is, for example, a number of the k-space rows to be recorded. At least two echoes may be refocused in each element of the gradient echo train: at least one stimulated echo (which is generated from the longitudinal magnetization prepared in the preparatory stage) and at least one "normal" gradient echo, which may also be regarded as "FID" (free induction decay) and the phase angle of which was not prepared in the preparatory stage. This makes it possible, for example, to determine the $B_0$ map for an entire slice with just one preparatory stage.

The unit including preparatory stage and acquisition stage, (e.g., including a gradient echo train), may be repeated to measure different slices. It is also possible to realize a three-dimensional measurement.

A further embodiment of the method provides for multiple FID signals triggered by the readout RF pulse and multiple stimulated echo signals triggered by the readout RF pulse to be acquired after each readout RF pulse of the gradient echo train.

These multiple FID signals and the multiple stimulated echo signals may then be used, by way of example, to increase the value range of the reconstructed B0 map via a suitable reconstruction (with two measured echoes, the value range is limited by the possible values of the phase differences of 0° to 360° between the two echoes). The data from these additional echoes may as well then be used to separate the fat and water signals using a Dixon reconstruction, for example.

A further embodiment of the method provides for the imaging sequence to include at least two successive sequence units, the multiple sequence units each including a preparatory stage and a subsequent acquisition stage, so that at least one acquisition stage of a sequence unit is directly followed by a preparatory stage of a subsequent sequence unit. Applied to the examination space here between this acquisition stage and the preparatory stage that directly follows it is at least one eddy current compensation gradient pulse.

The at least one eddy current compensation gradient pulse is advantageously suitable to offset, at least in part, any eddy currents generated in the magnetic resonance device by the preceding acquisition stage.

It is possible for eddy currents to be generated in the magnetic resonance device by an acquisition stage. The eddy currents have the potential to disturb the $B_0$ field in the examination space in a way that varies with time. It may only be a static $B_0$ field that is of interest for the creation of a $B_0$ map, meaning that it is only the static $B_0$ field that is to be measured. Such effects caused by the eddy currents, in particular eddy current effects of a higher spatial order, may advantageously be reduced on the $B_0$ map by the at least one eddy current compensation gradient pulse.

The at least one eddy current compensation gradient may include one component in the slice-selection direction and one component in the readout direction. The eddy current compensation gradient may include no component in the phase-encoding direction.

Additionally proposed is a magnetic resonance device that is able to execute one of the methods described above for the generation of a $B_0$ map for a magnetic resonance examination of an examination subject.

The advantages of the magnetic resonance device proposed corresponds to the advantages of the method for the generation of a $B_0$ map for a magnetic resonance examination of an examination subject as already explained in detail. Features, advantages, and alternative embodiments mentioned in this connection may also be transferred to the other subject matter claimed and vice versa.

Additionally proposed is a computer program product that includes a program and may be loaded directly into a memory of a programmable system control unit of a magnetic resonance device and has program resources, for example, libraries and auxiliary functions, to execute a method when the computer program product is executed in the system control unit of the magnetic resonance device. The computer program product may include software with a source code that still has to be compiled and linked or that only has to be interpreted, or an executable software code that for execution has only to be loaded into the system control unit.

The computer program product makes it possible to execute the method for the generation of a $B_0$ map for a magnetic resonance examination of an examination subject quickly and robustly in a manner that allows it to be repeated in identical form. The computer program product is configured such that it is able to execute the method acts by the system control unit. The system control unit in this case satisfies each of the necessary conditions such as, by way of example, a suitable working memory, a suitable graphics card, or a suitable logic unit so that the respective method acts may be executed efficiently.

The computer program product is stored, by way of example, on a computer-readable medium or filed on a network or server from where it may be loaded into the processor of a local system control unit, which system control unit may be directly connected with the magnetic resonance device or realized as part of the magnetic resonance device. Control information of the computer program product may in addition be stored on an electronically readable data carrier. The control information of the electronically readable data carrier may be such that it performs a method when the data carrier is used in a system control unit of a magnetic resonance device. Examples of electronically readable data carriers are a DVD, a magnetic tape, or a USB stick on which is stored electronically readable control information, in particular software. All the embodiments of the methods previously described may be performed when this control information is read from the data carrier and saved in a system control unit of the magnetic resonance device. The disclosure may thus also be based on the said computer-readable medium and/or the said electronically readable data carrier.

BRIEF DESCRIPTION OF THE DRAWINGS

Additional advantages, features, and details of the disclosure emerge from the exemplary embodiments described hereinbelow and with reference to the drawings. Corresponding parts have the same reference signs in all the figures, in which.

DETAILED DESCRIPTION

Figure 1:
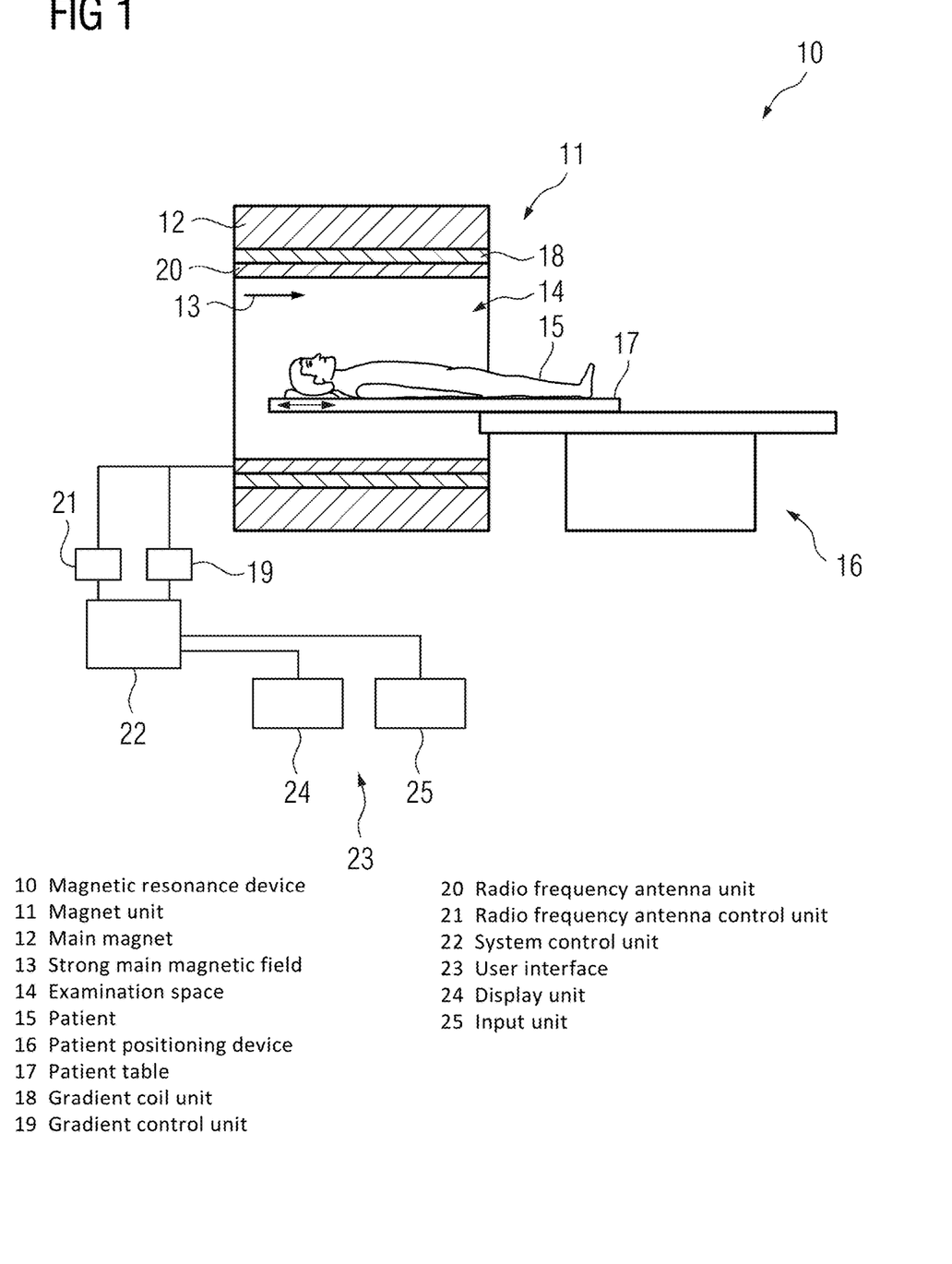
FIG. 1 depicts an example of a magnetic resonance device in a schematic diagram.

FIG. 1 is a schematic view of a magnetic resonance device 10. The magnetic resonance device 10 includes a magnet unit 11 that has a main magnet 12 for the generation of a strong main magnetic field 13 with a target magnetic field strength $B_{0,target}$ that is, in particular, constant over time. The magnetic resonance device 10 additionally includes an examination space 14 for receiving a patient 15. The examination space 14 in the present exemplary embodiment is cylindrical and is surrounded in a circumferential direction by the magnet unit 11. It is though perfectly conceivable for the examination space 14 to be realized in a different form. The patient 15 may be introduced into the examination space 14 using a patient positioning device 16 of the magnetic resonance device 10. The patient positioning device 16 has for this purpose a patient table 17 that may be moved within the examination space 14.

The magnet unit 11 additionally has a gradient coil unit 18 to generate magnetic field gradients by applying gradient pulses that are used, inter alia, for spatial encoding during imaging. The gradient coil unit 18 includes three gradient coils, for example, each for one spatial direction. The gradient coil unit 18 is controlled using a gradient control unit 19 of the magnetic resonance device 10. The magnet unit 11 additionally includes a radio frequency antenna unit 20, which in the present exemplary embodiment takes the form of a body coil permanently integrated into the magnetic resonance device 10. The radio frequency antenna unit 20 is controlled by a radio frequency antenna control unit 21 of the magnetic resonance device 10 and applies radio frequency pulses to an examination volume that is formed by an examination space 14 of the magnetic resonance device 10. The main magnetic field 13 generated by the main magnet 12 excites atomic nuclei by this method. The relaxation of the excited atomic nuclei generates magnetic resonance signals, in particular echo signals. The radio frequency antenna unit 20 is configured to receive the echo signals.

The magnetic resonance device 10 has a system control unit 22 for controlling the main magnet 12, the gradient control unit 19, and the radio frequency antenna unit 21. The system control unit 22 controls the magnetic resonance device 10 centrally, such as for the performance of a predefined imaging gradient echo sequence, for example. The system control unit 22 also includes an analysis unit, not shown in any greater detail, to analyze the echo signals acquired during the magnetic resonance examination. The analysis unit is in particular able to generate, with reference to the echo signals, a $B_0$ map showing the actual spatial distribution of the magnetic field strength of the main magnetic field 13. The magnetic resonance device 10 additionally includes a user interface 23 that is connected to the system control unit 22. Control information such as imaging parameters, for example, and reconstructed magnetic resonance images may be displayed for a medical operator on a display unit 24 of the user interface 23, for example, on at least one monitor. The user interface 23 also has an input unit 25 using which information and/or parameters may be input by the medical operator during a measurement operation.

Figure 2:
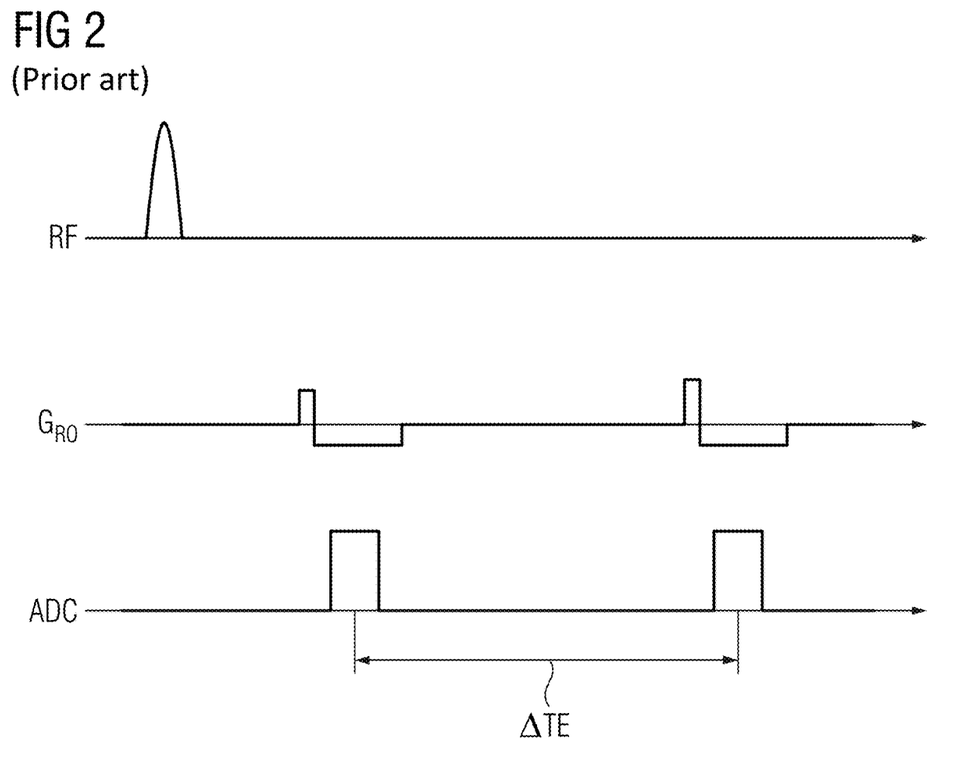
FIG. 2 depicts an example of a diagram of a dual echo gradient echo sequence for the generation of a $B_0$ map according to the prior art.

One possible problem forming a basis for the disclosure is the measurement of $B_0$ field distributions, also known as $B_0$ mapping. This may be used for the patient-specific optimization of shim currents, for the determination of a local resonant frequencies or for certain image correction procedures. As shown in FIG. 2, this is done according to the prior art by measuring multiple (e.g., two but possibly more) echo signals (e.g., during the readout window shown on the ADC axis) after application of an RF pulse (shown on the RF axis), each of which echo signals is generated with the aid of a preceding dephasing gradient and a subsequent rephasing gradient (shown on the $G_{RO}$ axis, which represents a readout direction).

The spatial distribution of the resonance frequency f is calculated from the phase difference of the measured echo signals. The resonant frequency f, in turn, is proportionate to the $B_0$ field strength, so the result is a $B_0$ map. In the straightforward and frequently applied instance, two echoes are measured (for example, in a gradient echo sequence) whose echo times differ by $\Delta TE$. Once the measured data belonging to the two echoes has been reconstructed, the resonant frequency for the $B_0$ field is calculated from their phase difference $\Delta \Phi$ according to Equation 1.

Consideration of the chemical shift between fat and water leads to the long measurement times already presented above when creating a $B_0$ map, especially in the case of low field strengths of the main magnetic field 13.

Figure 3:
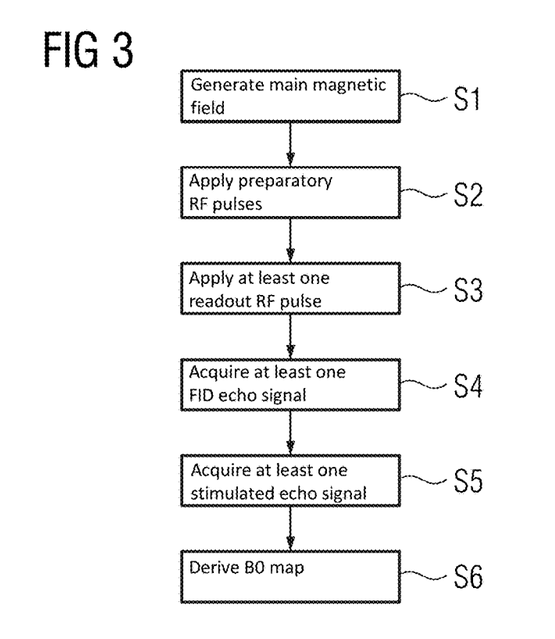
FIG. 3 depicts an example of a flowchart of a method for the generation of a $B_0$ map.

FIG. 3 shows a procedure for a method for the generation of a $B_0$ map for a magnetic resonance examination of an examination subject. Different acts of the method are explained with reference to FIGS. 4 and 5.

In act S1, a main magnetic field 13 with a target magnetic field strength $B_{0,target}$ is generated. In acts S2 to S5, an imaging sequence including a preparatory stage and a subsequent acquisition stage is applied to an examination space 14 in which the examination subject 15 is located.

In act S2, at least two preparatory RF pulses are applied during the preparatory stage, with a first of the at least two preparatory RF pulses being applied at a time $t_1$, a second of the at least two preparatory RF pulses being applied at a time $t_2$, and the times $t_1$ and $t_2$ being separated by a period TS.

Figure 4:
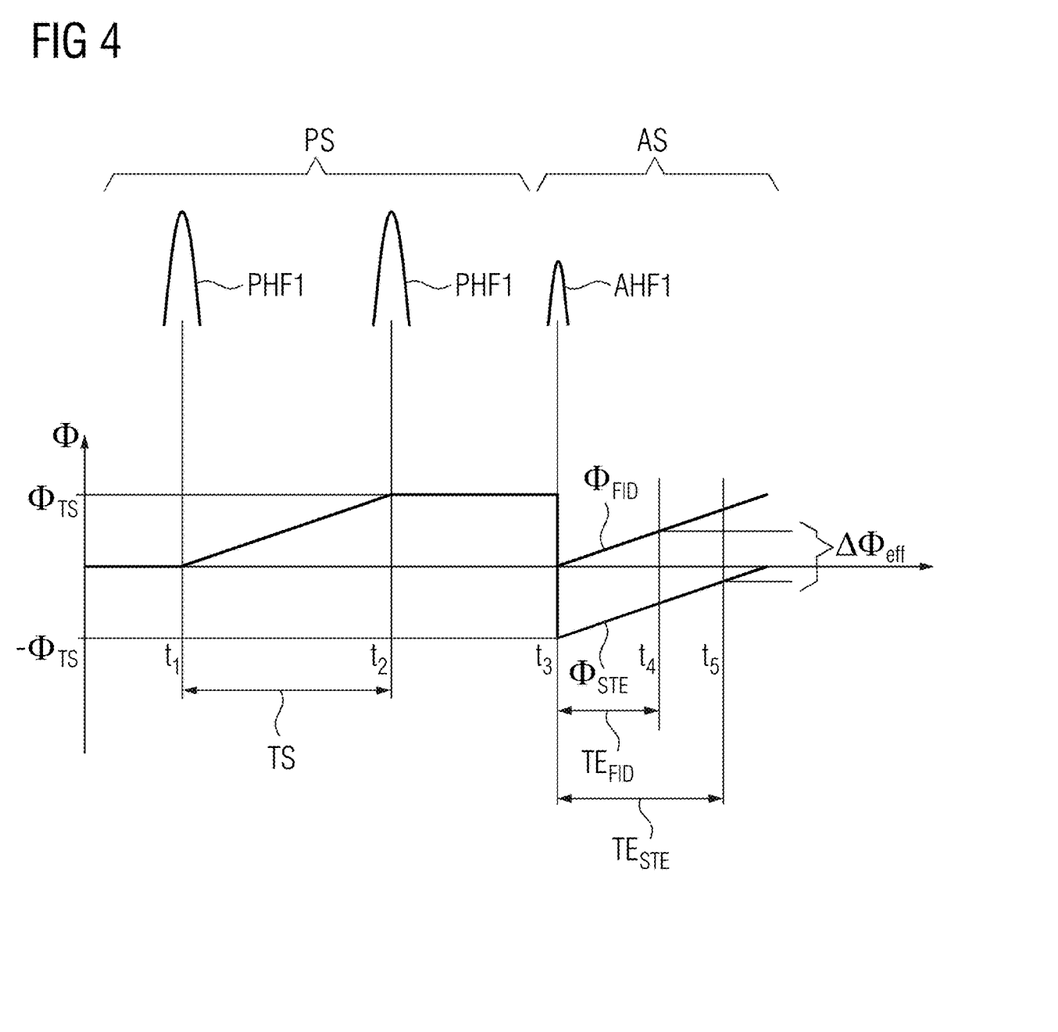
FIG. 4 depicts an example of a progression over time of a phase accumulation generated by off-resonance in a preparatory stage and a subsequent acquisition stage.

FIG. 4 shows that during a preparatory stage PS, a first preparatory RF pulse PHF1 is applied at a time $t_1$ and a second preparatory RF pulse PHF2 is applied at a time $t_2$. The two preparatory RF pulses are separated in time by the period TS.

Figure 5:
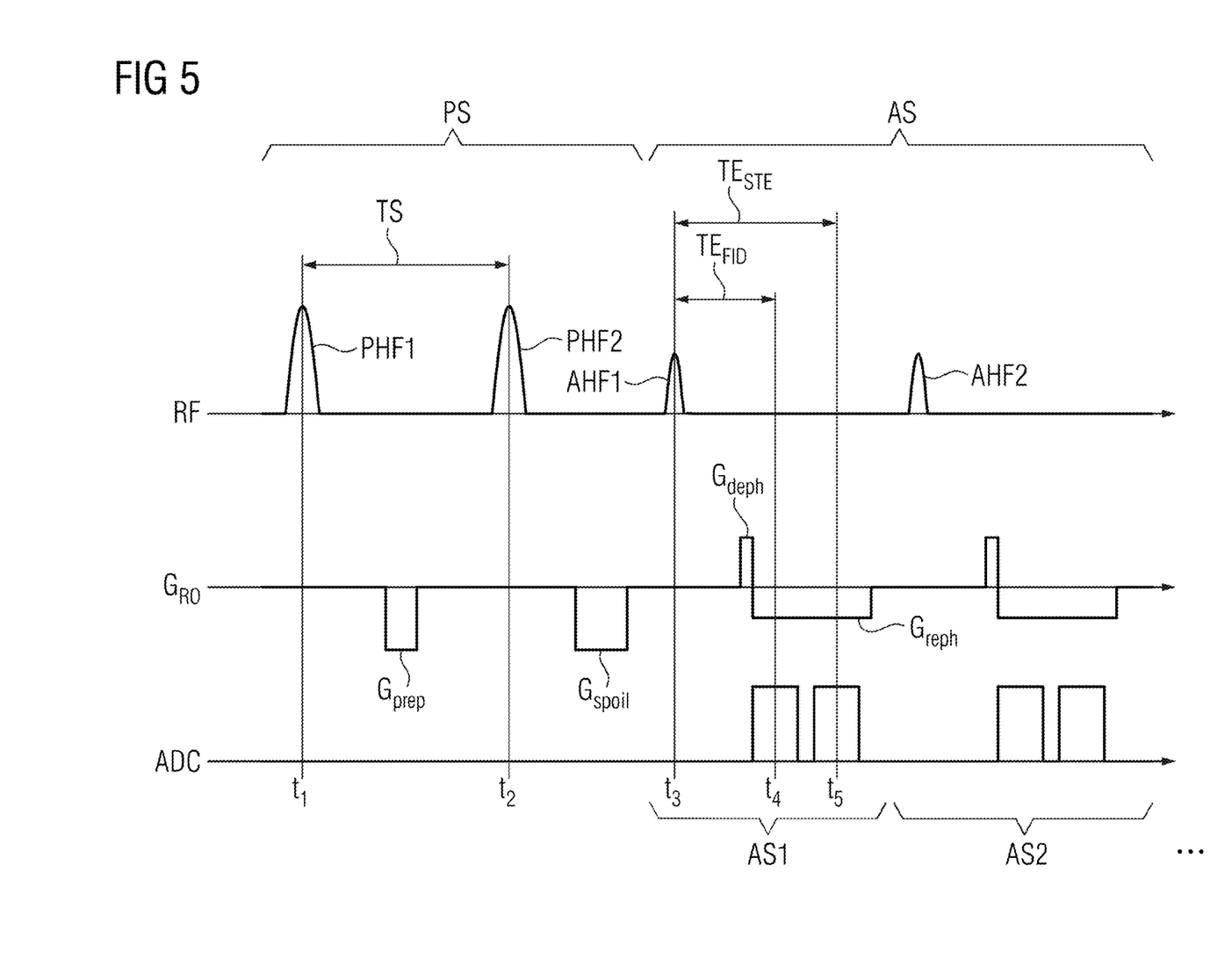
FIG. 5 depicts an example of a diagram of an imaging sequence for the generation of a $B_0$ map.

A phase $\Phi$ builds up to a value $\Phi_{TS}$ during the period TS as a result of off-resonance. The stronger the off-resonance is, the steeper will be the rise in the phase $\Phi$ and also in the value $\Phi_{TS}$. The two preparatory RF pulses PHF1 and PHF2 prepare longitudinal magnetization. Generated transverse magnetization is after the second preparatory RF pulse PHF2 with the spoiler gradient $G_{spoil}$, which is shown in FIG. 5.

In act S3, at least one readout RF pulse is applied at a time $t_3$ during the acquisition stage.

As may be seen in FIG. 4, the application of the readout RF pulse AHF1 causes the phase to be inverted from $\Phi_{TS}$ to $-\Phi_{TS}$. The phase $\Phi_{STE}$ then continues to increase. The phase accumulation $\Phi_{FID}$ of the FID echo signal also begins.

In act S4, at least one FID echo signal is acquired after the readout RF pulse at a time $t_4$, where times $t_3$ and $t_4$ are separated by a period $TE_{FID}$.

In act S5, at least one stimulated echo signal is acquired after the readout RF pulse at a time $t_5$, where times $t_3$ and $t_5$ are separated by a period $TE_{STE}$.

In act S6, a $B_0$ map that shows the actual spatial distribution of the magnetic field strength of the main magnetic field 13 is derived from the at least one acquired FID echo signal and the at least one acquired stimulated echo signal, the period TS being chosen so that echo signals from protons bound in water and echo signals from protons bound in fat experience the same dephasing.

As shown in FIG. 4, the phase accumulation $\Phi_{FID}$ at the time $t_4$ of the acquisition of the FID echo signal has a different value to the phase accumulation $\Phi_{STE}$ at the time $t_5$ of the acquisition of the stimulated echo signal. The difference $\Delta\Phi_{eff}$ thus is not equal to zero. The resonant frequency or the $B_0$ map may be calculated from the phase difference $\Delta\Phi_{eff}$ according to Equation 1 by replacing $\Delta TE$ in the equation with an effective dephasing time $\Delta TE_{eff}$.

The effective dephasing time $\Delta TE_{eff}$ here is the difference between the periods during which the signals of the two echoes each accumulate a phase due to off-resonance.

The FID echo signal accumulates a phase during the period $TE_{FID}$. The stimulated echo signal accumulates a phase during the period TS and during the time $TE_{STE}$ so that the phase accumulation period for the stimulated echo signal amounts to $-TS+TE_{STE}$. Consequently, the difference in the phase accumulation periods is $\Delta TE_{eff}=TE_{FID}-(-TS+TE_{STE})$.

Equation 3 may apply so that the echo signals from protons bound in water and echo signals from protons bound in fat experience the same dephasing.

The time TS between the RF pulses of the preparatory stage PS is to this end chosen in particular so that the effective dephasing time $\Delta TE_{eff}$ meets the fat/water in-phase condition. The period TS is specifically extended by a certain amount at low field strengths<2 T, e.g., <1 T. This means that for lower field strengths, an additional waiting time is inserted between the RF pulses of the preparatory stage PS to realize a suitable effective dephasing time $\Delta TE_{eff}$.

The extension of TS at low field strengths has the effect that with customary sequence timing, T2* compensation of the two echoes no longer happens, which makes this parameterization unsuitable for the reconstruction of a $B_1$ map. The method proposed here thus optimizes the parameters for the reconstruction of a B0 map without considering any possible suitability of the sequence for the creation of a $B_1$ map. It is thus possible that the acquired FID echo signals and stimulated echo signals will not be suitable for use in deriving a $B_1$ map that shows a spatial distribution of the flip angles of the at least two preparatory RF pulses.

To this end, the periods $TE_{FID}$ and $TE_{STE}$ may be defined first, with the period TS only being defined subsequently as a function of the periods $TE_{FID}$ and $TE_{STE}$ previously defined.

It is also conceivable for act S5 to come before act S4, that is to say $TE_{FID}<TE_{STE}$. The order of the echoes in the acquisition stage is in particular chosen so that with the sequence timing may be achievable for the two echoes, fat and water are in phase as far as possible. Signal losses due to fat and water components in phase opposition may otherwise occur in voxels in which both chemical bonding types are present. Accordingly, the stimulated echo is advantageously to be measured first before the FID gradient echo at field strengths of around 3 T or more. At lower field strengths, in contrast, the option presents itself to measure the FID gradient echo first before the stimulated echo, as shown in FIGS. 4 and 5.

As shown in FIG. 5, a gradient pulse $G_{prep}$ is applied to the examination space 14 between the two preparatory RF pulses PHF1 and PHF2 during the preparatory stage PS to adjust the periods $TE_{STE}$ and $TE_{FID}$. A dephasing gradient pulse $G_{reph}$ is additionally applied to the examination space 14 after the application of the readout RF pulse AHF1 and before the acquisition of the FID signal and the stimulated echo signal during the acquisition stage AS. A rephasing gradient pulse $G_{reph}$ is additionally applied to the examination space 14 during the acquisition of the FID signal and the stimulated echo signal during the acquisition stage AS.

The respective echo signal may occur when the rephasing gradient moment is equal to a preceding dephasing gradient moment. The times $t_4$ and $t_5$ of the FID echo signal and the stimulated echo signal may be adjusted accordingly by the timing and form of the gradient pulses $G_{prep}$, $G_{deph}$, and $G_{reph}$.

As shown in FIG. 5, the acquisition stage AS may include a gradient echo train with multiple readout RF pulses AHF1, AHF2, . . . , at least one FID signal triggered by the readout RF pulse and at least one stimulated echo signal triggered by the readout RF pulse being acquired after each readout RF pulse of the gradient echo train. In particular, one k-space row may be recorded with each of the multiple readout RF pulses AHF1, AHF2, . . . . This makes it possible, for example, to measure an entire slice with just one preparatory stage PS.

FIG. 5 shows that it is only ever one FID signal and one stimulated echo signal that are recorded after a readout RF pulse. It is also conceivable, however, for multiple FID signals triggered by the readout RF pulse and multiple stimulated echo signals triggered by the readout RF pulse to be acquired after each readout RF pulse of the gradient echo train. These may then be used to increase the value range of the reconstructed $B_0$ map via a suitable reconstruction. The data from these additional echoes may then be used to separate the fat and water signals using a Dixon reconstruction, for example.

Figure 6:
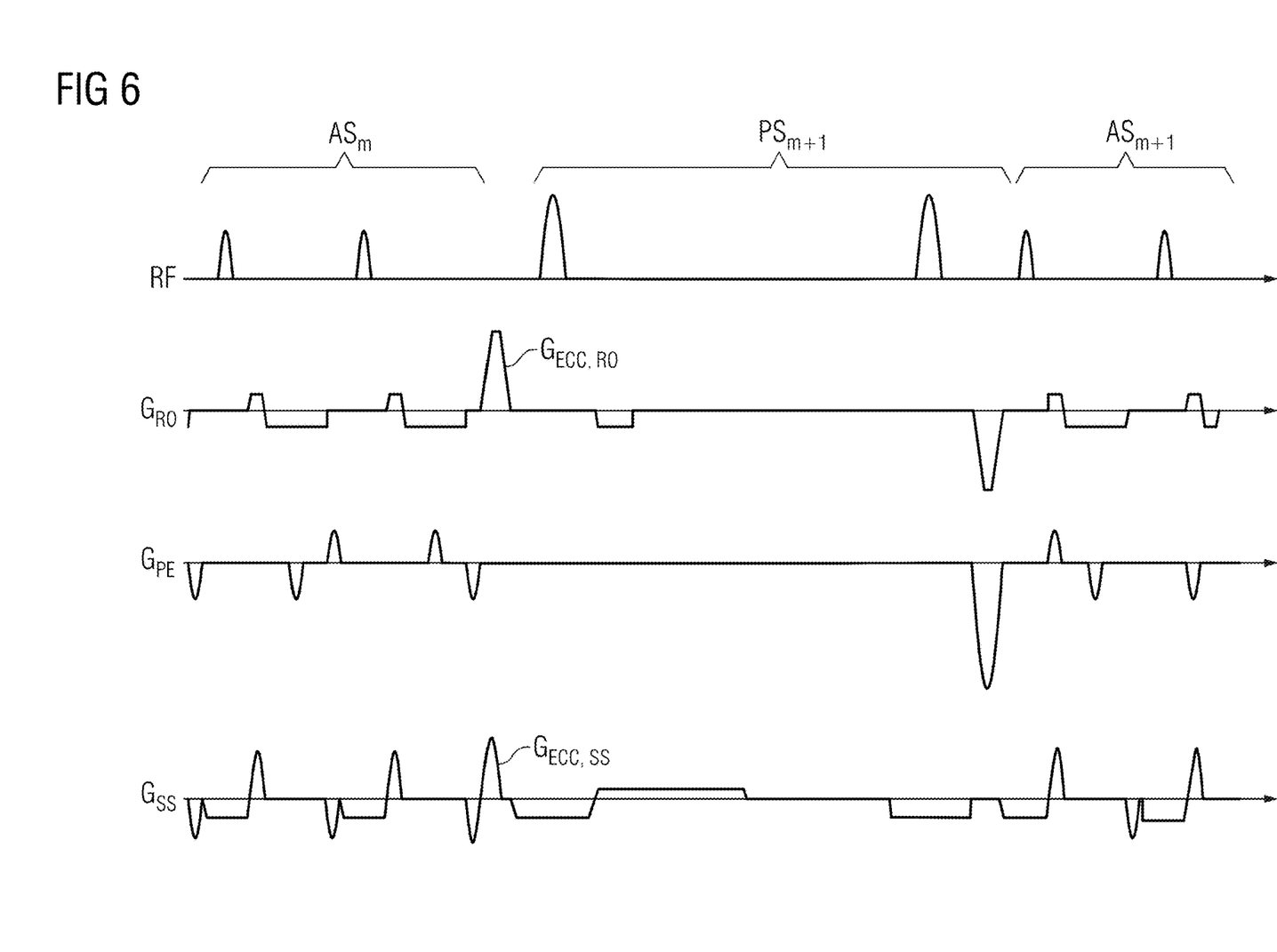
FIG. 6 depicts an example of a diagram of an imaging sequence with an eddy current compensation gradient pulse.

FIG. 6 illustrates a sequence that includes multiple successive sequence units, each having a preparatory stage and an acquisition stage. In particular, each sequence unit measures one slice of the patient 15. Shown is the end of the $m^{th}$ acquisition stage $AS_m$ of the $m^{th}$ sequence unit. This is followed by the m+1$^{th}$ preparatory stage $PS_{m+1}$ and the start of the m+1$^{th}$ acquisition stage $AS_{m+1}$ of the m+1$^{th}$ sequence unit. An eddy current compensation gradient pulse $G_{ECC,RO}$ in the readout direction and an eddy current compensation gradient pulse $G_{ECC,SS}$ in the slice-selection direction are applied to the examination space 14 between the acquisition stage $AS_m$ and the subsequent preparatory stage $PS_{m+1}$.

Every gradient pulse may induce eddy currents. Assuming that the time constant for the decay of the eddy currents is long relative to the duration of the gradient pulse, it may be shown that the strength of the eddy currents approximately corresponds to the moment of the gradient pulse causing the eddy current. Such eddy currents may cause a disturbance of the static main magnetic field 13 that changes over time. In certain examples, only the static main magnetic field 13 is to be measured.

Here, the eddy current compensation gradient pulses $G_{ECC,RO}$ and $G_{ECC,SS}$ are applied at the end of the acquisition stage ASm, (e.g., of a gradient echo train), for this purpose. Their moment is advantageously such that the eddy currents they generate at least partially offset the eddy currents caused by the preceding gradient pulses. Eddy currents of a higher spatial order, that is to say second order and higher, may be offset by this method. This means that any $B_0$ maps determined in S6 will be less distorted by eddy currents.

The eddy current compensation gradient pulses may be calculated on the basis of time constants of the decay of the eddy currents. These time constants may be calculated individually for each magnetic resonance device 10 or average values may be calculated for magnetic resonance devices of the same type.

The eddy current compensation gradient pulses may be applied only in the slice-selection direction $G_{SS}$ and the readout direction $G_{RO}$. The overall moment of the phase-encoding gradient pulses is advantageously approximately zero.

It may be stated in summary that the method shown in FIG. 3 in particular makes it possible to realize a low measurement time. Suitable effective dephasing periods $\Delta TE_{\it{eff}}$ (e.g., fat and water are in phase for both echoes) may be realized, in particular for low field strengths as well, without any significant increase in the overall measurement time. It is sufficient that additional "waiting time" to realize the effective dephasing time with decreasing field strength is applied just once per measured slice, for example, and not (as in the conventional method according to FIG. 1) with every sequence element that measures a k-space row.

Finally, it is emphasized once again that the methods described in detail above and the magnetic resonance device are just exemplary embodiments that may be modified in various ways by the person skilled in the art without moving beyond the scope of the disclosure. Furthermore, the use of the indefinite article "a" does not preclude there actually being present more than one of the features/attributes concerned. Similarly, the term "unit" does not preclude the components concerned being composed of multiple interacting sub-components that may also be spatially distributed.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

Although the disclosure has been illustrated and described in detail with the exemplary embodiments, the disclosure is not restricted by the examples disclosed and other variations may be derived therefrom by a person skilled in the art without departing from the protective scope of the disclosure.

The invention claimed is:

1. A method for generation of a $B_0$ map for a magnetic resonance examination of an examination subject, the method comprising:
   generating a main magnetic field;
   applying to an examination space in which the examination subject is located of an imaging sequence having a preparatory stage and a subsequent acquisition stage, wherein the imaging sequence comprises:
      applying at least two preparatory radio-frequency (RF) pulses during the preparatory stage, wherein a first preparatory RF pulse of the at least two preparatory RF pulses is applied at a time $t_1$, wherein a second preparatory RF pulse of the at least two preparatory RF pulses is applied at a time $t_2$, wherein the times $t_1$ and $t_2$ are separated by a period TS;
      applying at least one readout RF pulse at a time $t_3$ during the acquisition stage;
      acquiring at least one free induction decay (FID) echo signal after the readout RF pulse at a time $t_4$, wherein the times $t_3$ and $t_4$ are separated by a period $TE_{FID}$; and
      acquiring at least one stimulated echo signal after the at least one readout RF pulse at a time $t_5$, wherein the times $t_3$ and $t_5$ are separated by a period $TE_{STE}$; and
   deriving a $B_0$ map that shows an actual spatial distribution of a magnetic field strength of the main magnetic field from the at least one FID echo signal and the at least one stimulated echo signal,
   wherein the period TS is chosen as a function of the periods $TE_{FID}$ and $TE_{STE}$ so that, between the times $t_4$ and $t_5$, a signal component of the echo signals from protons bound in water has a same phase difference as a signal component of the echo signals from protons bound in fat.

2. The method of claim 1, wherein the choosing of the period TS comprises:
   specifying the periods $TE_{FID}$ and $TE_{STE}$ so that these are as short as possible; and
   determining the period TS as a function of the specified periods $TE_{FID}$ and $TE_{STE}$.

3. The method of claim 1, wherein:

$$TS = N * \frac{1}{\delta_{WF} * (\gamma/2\pi) * B_{0,target}} + TE_{STE} - TE_{FID}$$

wherein:
   N is an integer>0,
   $\delta_{WF}$ indicates a chemical shift of water and fat, and
   $\gamma$ indicates a gyromagnetic ratio of protons bound in water.

4. The method of claim 3, wherein N=1.

5. The method of claim 1, wherein the main magnetic field has a target magnetic field strength $B_{0,target}$ of less than 2 T.

6. The method of claim 1, wherein $TE_{FID}$<5 ms and $TE_{STE}$<6 ms.

7. The method of claim 1, wherein $TE_{FID}$<2.5 ms and $TE_{STE}$<3.5 ms.

8. The method of claim 1, wherein the at least one FID echo signal and the at least one stimulated echo signal are not suitable for use in deriving a $B_1$ map that shows a spatial distribution of flip angles of the at least two preparatory RF pulses.

9. The method of claim 1, wherein, to adjust the periods $TE_{STE}$ and $TE_{FID}$:
   at least one gradient pulse $G_{prep}$ is applied to the examination space between the at least two preparatory RF pulses during the preparatory stage,
   at least one gradient pulse $G_{deph}$ is applied to the examination space after the applying of the readout RF pulse and before the acquiring of the at least one FID signal and the at least one stimulated echo signal during the acquisition stage, and
   at least one gradient pulse $G_{reph}$ is applied to the examination space during the acquiring of the at least one FID signal and the at least one stimulated echo signal during the acquisition stage.

10. The method of claim 1, wherein $TE_{FID}$<$TE_{STE}$.

11. The method of claim 1, wherein the acquisition stage comprises a gradient echo train with multiple readout RF pulses, and wherein at least one FID signal triggered by the readout RF pulse and at least one stimulated echo signal triggered by the readout RF pulse are acquired after each readout RF pulse of the gradient echo train.

12. The method of claim 11, wherein one k-space row is recorded with each readout RF pulse of the multiple readout RF pulses.

13. The method of claim 11, wherein multiple FID signals triggered by the readout RF pulse and multiple stimulated echo signals triggered by the readout RF pulse are acquired after each readout RF pulse of the gradient echo train.

14. The method of claim 1, wherein the imaging sequence comprises at least two successive sequence units,
wherein each sequence unit of the sequence units comprises a preparatory stage and a subsequent acquisition stage so that at least one acquisition stage of a sequence unit is directly followed by a preparatory stage of a subsequent sequence unit, and
wherein at least one eddy current compensation gradient pulse is applied to the examination space between the acquisition stage and the preparatory stage that directly follows the acquisition stage.

15. A magnetic resonance device comprising:
a main magnet configured to generate a main magnetic field; and
an examination space in which an examination subject is configured to be positioned,
wherein the magnetic resonance device is configured to generate an imaging sequence comprising:
applying at least two preparatory radio-frequency (RF) pulses during a preparatory stage, wherein a first preparatory RF pulse of the at least two preparatory RF pulses is applied at a time $t_1$, wherein a second preparatory RF pulse of the at least two preparatory RF pulses is applied at a time $t_2$, wherein the times $t_1$ and $t_2$ are separated by a period TS;
applying at least one readout RF pulse at a time $t_3$ during an acquisition stage;
acquiring at least one free induction decay (FID) echo signal after the readout RF pulse at a time $t_4$, wherein the times $t_3$ and $t_4$ are separated by a period $TE_{FID}$; and
acquiring at least one stimulated echo signal after the at least one readout RF pulse at a time $t_5$, wherein the times $t_3$ and $t_5$ are separated by a period $TE_{STE}$,
wherein the magnetic resonance device is further configured to derive a $B_0$ map that shows an actual spatial distribution of a magnetic field strength of the main magnetic field from the at least one FID echo signal and the at least one stimulated echo signal, and
wherein the period TS is chosen as a function of the periods $TE_{FID}$ and $TE_{STE}$ so that, between the times $t_4$ and $t_5$, a signal component of the echo signals from protons bound in water has a same phase difference as a signal component of the echo signals from protons bound in fat.

16. A non-transitory computer program product comprising a program configured to be loaded directly into a memory of a programmable system control unit of a magnetic resonance device, wherein the program, when executed in the programmable system control unit of the magnetic resonance device, causes the magnetic resonance device to:
generate a main magnetic field;
apply to an examination space in which an examination subject is located of an imaging sequence having a preparatory stage and a subsequent acquisition stage, wherein the imaging sequence comprises:
applying at least two preparatory radio-frequency (RF) pulses during the preparatory stage, wherein a first preparatory RF pulse of the at least two preparatory RF pulses is applied at a time $t_1$, wherein a second preparatory RF pulse of the at least two preparatory RF pulses is applied at a time $t_2$, wherein the times $t_1$ and $t_2$ are separated by a period TS;
applying at least one readout RF pulse at a time $t_3$ during the acquisition stage;
acquiring at least one free induction decay (FID) echo signal after the readout RF pulse at a time $t_4$, wherein the times $t_3$ and $t_4$ are separated by a period $TE_{FID}$; and
acquiring at least one stimulated echo signal after the at least one readout RF pulse at a time $t_5$, wherein the times $t_3$ and $t_5$ are separated by a period $TE_{STE}$; and
derive a $B_0$ map that shows an actual spatial distribution of a magnetic field strength of the main magnetic field from the at least one FID echo signal and the at least one stimulated echo signal,
wherein the period TS is chosen as a function of the periods $TE_{FID}$ and $TE_{STE}$ so that, between the times $t_4$ and $t_5$, a signal component of the echo signals from protons bound in water has a same phase difference as a signal component of the echo signals from protons bound in fat.

* * * * *